United States Patent
Letertre

(10) Patent No.: US 7,863,650 B2
(45) Date of Patent: Jan. 4, 2011

(54) MULTILAYER STRUCTURE AND FABRICATION THEREOF

(75) Inventor: Fabrice Letertre, Meylan (FR)

(73) Assignee: S.O.I. TEC Silicon on Insulator Technologies, Bernin (FR)

( * ) Notice: Subject to any disclaimer, the term of this patent is extended or adjusted under 35 U.S.C. 154(b) by 0 days.

(21) Appl. No.: 12/564,147

(22) Filed: Sep. 22, 2009

(65) Prior Publication Data

US 2010/0006857 A1  Jan. 14, 2010

Related U.S. Application Data

(62) Division of application No. 11/899,340, filed on Sep. 5, 2007, now Pat. No. 7,611,974.

(30) Foreign Application Priority Data

Feb. 14, 2007  (FR) .................................. 07 53260

(51) Int. Cl.
*H01L 31/0328* (2006.01)
(52) U.S. Cl. .................. 257/200; 257/201; 257/347; 257/615; 257/616; 257/189; 257/E21.32; 257/E21.545; 438/479; 438/763; 438/933
(58) Field of Classification Search .................. 257/200, 257/201, 347, 615, 616, E21.32, E21.545, 257/189, 13, 840; 438/479, 763, 933
See application file for complete search history.

(56) References Cited

U.S. PATENT DOCUMENTS

| 3,914,137 | A | * | 10/1975 | Huffman et al. .............. 438/24 |
| 5,108,947 | A | | 4/1992 | Demeester et al. |
| 5,286,985 | A | | 2/1994 | Taddiken |
| 6,645,829 | B2 | | 11/2003 | Fitzergald |
| 6,677,655 | B2 | | 1/2004 | Fitzergald |
| 6,730,943 | B2 | | 5/2004 | Massies et al. |
| 2003/0136333 | A1 | | 7/2003 | Semond et al. |
| 2004/0012037 | A1 | | 1/2004 | Venkatesan et al. |

(Continued)

FOREIGN PATENT DOCUMENTS

EP  0306153  3/1989

(Continued)

OTHER PUBLICATIONS

Material and Optical Properties of GaAs Grown on (001) Ge/Si Pseudo-Substrate; Mat. Res. Soc. Symp. Proc. vol. 809; Copyright 2004 Materials Research Society.

(Continued)

*Primary Examiner*—Tu-Tu V Ho
(74) *Attorney, Agent, or Firm*—Edwards Angell Palmer & Dodge LLP

(57) ABSTRACT

A process for fabricating a multilayer structure is provided as well as the structure itself. In accordance with one embodiment, the process includes growing a growth layer on a silicon substrate by epitaxial growth, forming at least one pattern from the growth layer, depositing an oxide layer on the silicon substrate, transferring a silicon active layer onto the oxide layer, forming a cavity in the silicon active layer oxide layer above the pattern, and growing a III-V material in the cavity.

7 Claims, 4 Drawing Sheets

U.S. PATENT DOCUMENTS

2004/0232428 A1 11/2004 Senda et al.
2004/0252931 A1 12/2004 Belleville et al.

FOREIGN PATENT DOCUMENTS

WO WO-0213342 2/2002
WO WO-2008099246 8/2008

OTHER PUBLICATIONS

High-Quality Ge Epilayers on Si with Low Threading-Dislocation Densities; Applied Physics Letters; vol. 75, No. 19; Nov. 8, 1999.

* cited by examiner

MULTILAYER STRUCTURE AND FABRICATION THEREOF

CROSS REFERENCE TO RELATED APPLICATION

This application claims priority to and is a divisional of U.S. patent application Ser. No. 11/899,340 filed Sep. 5, 2007, which in turn claims priority to French Patent Application No. FR0753260, filed Feb. 14, 2007. The entirety of the content of each of the aforementioned patent applications is incorporated herein by reference.

BACKGROUND OF THE INVENTION

1. Field of the Invention

The present invention relates to a process for fabricating multilayer composite structures that integrate electronic, optoelectronic, and/or power components and functionalities.

2. Background of the Related Art

Many unsuccessful attempts have been made to find satisfactory methods for producing structures integrating electronic metal oxide semiconductor (MOS) layers and electronic, optoelectronic, and/or power components of the III-V semiconductor type. The production of such structures integrating electronic components on a single platform requires combining single-crystal silicon layers of high crystalline quality, for producing MOS layers such as complementary metal oxide semiconductors (CMOS) circuits, with III-V semiconductor type materials (such as GaAs, InP and other similar alloys) to form electronic, optoelectronic and/or power components.

The direct epitaxial growth of III-V semiconductor materials on silicon by chemical vapor deposition (CVD) techniques and molecular beam epitaxy (MBE) techniques has been studied over recent decades without obtaining good results in terms of crystalline quality. These techniques have encountered problems of emergent dislocations, antiphase domains, and point defects, among others.

According to another known technique, it is possible to physically transfer thin single-crystal films of InP or GaAs material onto a silicon substrate without significantly impairing the intrinsic crystalline quality of these films. This technique is described in an article by E. Jalaguier et al. titled *Transfer of 3 in GaAs Film on Silicon Substrate by Proton Implantation Process*, published in Electronics Letters, Feb. 19, 1998, Vol. 34, No. 4, pp. 408-409. This film transfer is carried out using the well-known Smart-Cut™ technology, an example of which is described in U.S. Pat. No. 5,374,564 and in an article by A. J. Auberton-Hervé et al. titled *Why Can Smart-Cut Change the Future of Microelectronics?*, published in the International Journal of High-Speed Electronics and Systems, Vol. 10, No. 1, 2000, pp. 131-146.

Furthermore, it has been demonstrated that it is possible to combine the growth techniques with film transfer techniques in order to integrate silicon and III-V materials on the same mechanical platform.

According to a first method of implementation, one way of obtaining GaAs on a 200 mm diameter silicon wafer, without having a GaAs donor substrate, consists in growing GaAs on a single-crystal germanium (Ge) substrate. Growing GaAs on germanium makes it possible to obtain very high-quality thin films owing to the very small lattice parameter mismatch between these two materials. However, because of the cost and mechanical fragility of these bulk substrates, it is more advantageous to transfer a thin germanium film on silicon (such as GaAs and InP) and then carry out crystalline growth of GaAs. The GaAs thus obtained has a quality equivalent to GaAs grown epitaxially on a bulk GaAs substrate.

GeOI structure (germanium on silicon with an intermediate insulating film) has been demonstrated on large diameters (up to 200 mm). To date, this is the most direct methodology for combining silicon and GaAs.

However, for the integration of microelectronic, optoelectronic and/or power functions on silicon and III-V materials, this structure has several drawbacks. With an epitaxially grown GaAs/Ge transferred structure, it is difficult to produce CMOS components on the silicon support substrate because it is necessary to first locally expose the silicon in order to fabricate the circuit thereon. In addition to the problem of specific thermal budget during the fabrication, the topology makes it difficult, or even impossible for the circuit to be electrically connected to the optical component.

According to a second method of implementing this technique, structures with a silicon active layer for the surface CMOS components and an optically active layer beneath the silicon layer have thus been developed for overcoming these drawbacks.

U.S. Pat. No. 6,645,829 and U.S. Pat. No. 6,677,655 describe the fabrication of structures that include buried active optical layers, such as a [Si substrate/oxide ($SiO_2$)/Ge layer/Si layer] or else a [Si substrate/oxide ($SiO_2$)/Si layer/Ge layer/oxide ($SiO_2$)/Si layer].

However, in structures of this type, the optically active layer is always in direct contact with a silicon layer of higher or lesser quality depending on the method of fabrication (epitaxy or bonding) used for producing the silicon layer. Moreover, U.S. Patent Application Publication No. 2004/0252931 discloses forming multilayer structures by bonding a multilayer monolithic electronic device, which includes an electrically active layer and an optically active layer, to another layer, the electrical and optical layers possibly being silicon on insulator (SOI) layers transferred onto a support substrate.

SUMMARY OF THE INVENTION

Advantages of the present invention will be set forth in and become apparent from the description that follows. Additional advantages of the invention will be realized and attained by methods and systems particularly pointed out in the written description and claims, as well as the appended drawings.

To achieve these and other advantages and in accordance with the propose of the invention, as embodied herein, the present disclosure provides a solution for producing a multilayer structure that homogeneously integrates III-V materials and silicon active layers, while at the same time simplifying the number of steps needed, thus improving the fabrication yield.

In accordance with one embodiment, the invention relates to a process for fabricating a multilayer structure. A particular exemplary embodiment of the method includes growth (such as epitaxial growth) of a growth layer on a silicon substrate. A pattern is preferably formed proximate (such as on top of) the growth layer. An oxide layer is next deposited on the silicon substrate, onto which a silicon active layer is disposed (such as by transfer). A cavity is then formed through the silicon layer and oxide layer proximate the pattern to expose the growth layer proximate the pattern. A III-V material may then be grown on the growth layer in the cavity.

In accordance with another embodiment, the invention also provides a structure. In accordance with a particular embodiment, the structure may include a surface having both an active silicon layer for MOS components and one or more islands of III-V materials for electronic, optoelectronic and/or power components. Embodiments of the structure disclosed herein are produced more simply than the structures produced by prior processes. In accordance with particular embodiments, this can result from a single layer transfer through the entire fabrication cycle.

In accordance with a further aspect of the invention, each pattern used may be produced by chemically etching the growth layer through a first aperture mask applied on the growth layer. The number and form of the patterns may vary. If a plurality of patterns are formed, each of the patterns are preferably uniformly spaced apart from each other.

In accordance with another aspect of the invention, the cavity may be formed by chemically etching the silicon active layer and the oxide layer through a second aperture mask applied on the silicon active layer, the mask being aligned with respect to each pattern of the growth layer.

The silicon active layer may be provided by bonding an SOI structure onto the oxide layer. The base substrate of the SOI structure may then be removed after bonding. The silicon substrate is preferably but not exclusively a misoriented silicon substrate.

The growth layer may include a germanium layer and the III-V material may include material chosen from at least gallium arsenide (GaAs), AlGaAs and InGaAs. Moreover, the growth layer may also be an aluminum nitride layer (AlN). In this case, the III-V material may include a material chosen from at least GaN, AlGaN, InGaN and ZnGaN.

In further accordance with the invention, the process may further include at least one heat treatment step to allow the dislocations to migrate toward the edges of each pattern and to be annihilated. Preferably, this step is carried out after formation of the pattern but before formation of the oxide layer.

The present invention also relates to a multilayer structure. In accordance with a particular embodiment, the structure includes a silicon substrate, at least one pattern disposed proximate the substrate formed from a growth layer of a III-V material, an oxide layer disposed on the silicon substrate, and a silicon active layer disposed on the oxide layer. The oxide layer and the silicon active layer each define a cavity above each pattern of the growth layer, the cavity being filled with a III-V material.

It is to be understood that the foregoing general description and the following detailed description are exemplary and are intended to provide further explanation of the invention claimed.

The accompanying drawings, which are incorporated in and constitute part of this specification, are included to illustrate and provide a further understanding of the method and system of the invention. Together with the description, the drawings serve to explain principles of the invention.

BRIEF DESCRIPTION OF THE DRAWINGS

The features and advantages of the present invention will become more clearly apparent from the following description, given as non-limiting examples, in conjunction with the appended drawings in which.

DETAILED DESCRIPTION OF EMBODIMENTS OF THE INVENTION

Reference will now be made in detail to the present preferred embodiments of the invention, examples of which are illustrated in the accompanying drawings. The method and corresponding steps of the invention will be described in conjunction with the detailed description of the structure of the invention.

The present invention applies in general to the production of multilayer structures, preferably in the form of wafers, allowing easy integration of electronic components (for example FET, MOSFET or HBT transistors), optoelectronic components (for example light sources/detectors) and/or power components (for example a high electron mobility transistor (HEMT) based on III-V materials on a microelectronic circuit based on silicon technology. This type of circuit may comprise all the components usually encountered in silicon technology, such as those for producing logic and/or analog functions, memory functions, and the like.

The multilayer structure includes an active silicon surface layer and one or more islands of III-V material emerging from this silicon layer. One process for fabricating a multilayer structure according to one exemplary embodiment of the invention will now be described with reference to FIGS. 1A to 1K and FIG. 2.

Figure 1A:
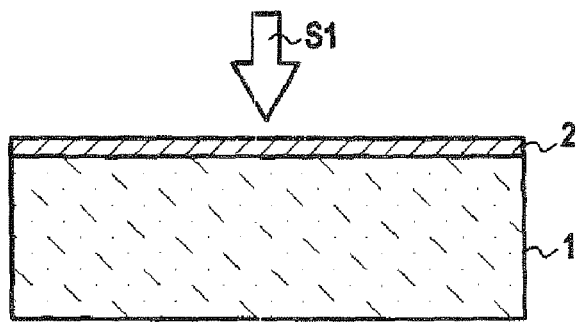
FIGS. 1A to 1K are schematic sectional views showing the fabrication of a multilayer structure according to one method of implementing the invention.
Figure 1B:
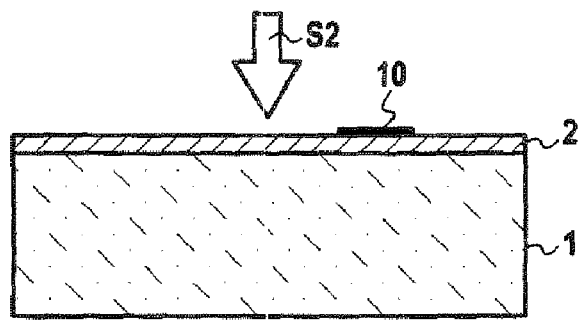

In accordance with the illustrated embodiment, the first step includes forming a germanium layer 2 on a silicon substrate 1 such as by epitaxial growth (step S1, FIG. 1A). The germanium layer 2 corresponds to a growth layer, that is to say, a growth nucleation or seed layer, from which a III-V material will subsequently be formed by selective epitaxial regrowth. Epitaxial growth is a well-known technique and will consequently not be described in greater detail.

The germanium layer 2 thus formed has a thickness of between approximately 100 nanometers and 10 microns and has a dislocation density of between approximately $1 \times 10^6/cm^2$ and $1 \times 10^8/cm^2$.

The silicon substrate 1 may be formed from an oriented silicon substrate (the crystal axis and the (100) surface normal being aligned) or a misoriented silicon substrate (there being an angle, also called a "miscut" or "offcut", between the crystal axis and the (100) surface normal). In one exemplary embodiment, the substrate 1 is a misoriented silicon substrate as it allows an epitaxial growth layer to be obtained with very few defects.

Figure 1C:
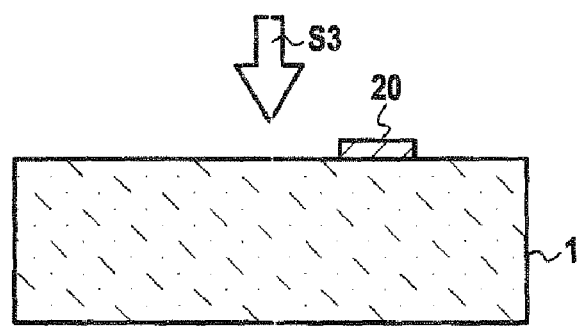

The second step includes forming one or more germanium patterns from the germanium layer 2. In one exemplary embodiment, a mask 10 can be applied on the germanium layer 2, for example by lithography (step S2, FIG. 1B) and then those parts of the germanium layer 2 that are exposed through the apertures in the mask 10 are chemically etched (step S3, FIG. 1C). Once the etching has been completed and the mask removed, a germanium pattern 20 remains on the silicon substrate 1, as shown in FIG. 1C.

In the example described above, only a single germanium pattern is formed. However, it should be understood that several patterns may be formed from the growth layer. Likewise, each pattern is not limited to a particular shape. The patterns may be of any shape (square, round, or annular, for example), depending on the requirements. The formation of one or more patterns may furthermore be obtained using other etching techniques, such as, for example, plasma etching or ion etching.

When several patterns are formed, the patterns are preferably uniformly spaced apart on the silicon substrate 1. The silicon substrate 1 with the germanium pattern 20 may furthermore undergo a thermal cycle for removing practically all the dislocations at the pattern 20 by the dislocations migrating toward the edges of the pattern followed by annihilation (step S4, FIG. 2). Such thermal cycling is described, for example, in the document by Luan et al., titled *High-quality Ge Epilayers on Si with Low Threading-Dislocation Densities*, APL 75 No. 19, November 1999, pp. 2909-2911. This cycling is carried out at temperatures of around 800 to 1000° C. for a time ranging from a few minutes to a several hours. Several thermal cycles may sometimes be necessary.

Figure 1D:
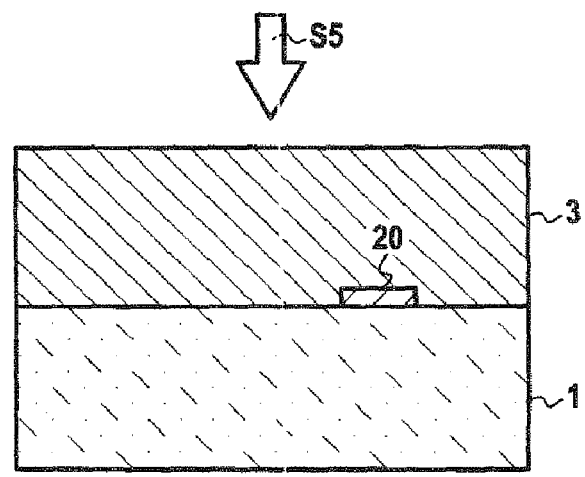

Next, a thick oxide bonding layer 3 is deposited on the silicon substrate 1 and on the germanium pattern 20 (step S5, FIG. 1D). The oxide bonding layer is for example an $SiO_2$ layer with a thickness of a few hundred nanometers if the germanium layer 2 is unpatterned (i.e. no patterns formed). Otherwise, the $SiO_2$ layer has a thickness of about three times the height of the germanium pattern(s) formed. The surface of the oxide bonding layer 3 is planarized (step S6, FIG. 2), for example by chemical-mechanical polishing (CMP).

Figure 1E:
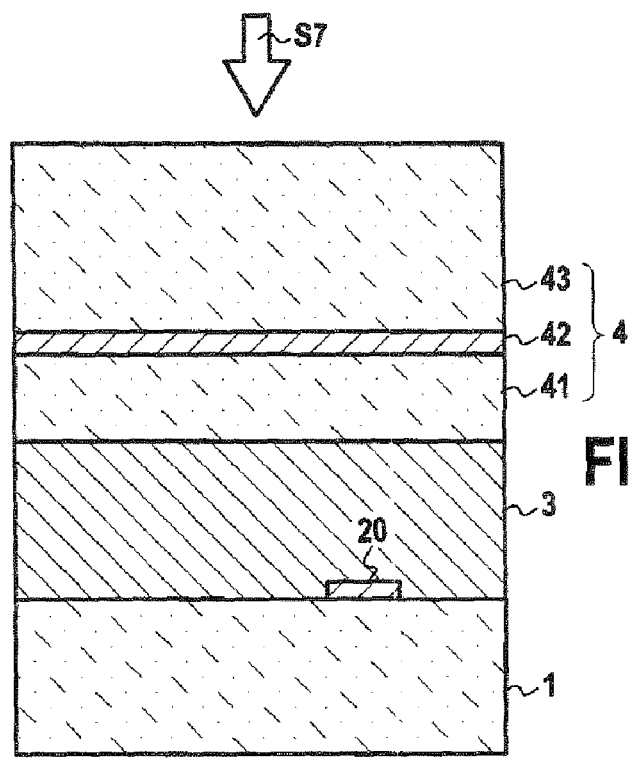

An SOI structure 4 is then bonded on to the surface of the oxide bonding layer 3 (step S7, FIG. 1E). The SOI structure 4 comprises, a silicon substrate 43, a buried oxide ($SiO_2$) layer 42 and a silicon active layer 41, that is, a single-crystal silicon layer of high crystalline quality, allowing the production of MOS electronic components. Such an SOI structure may be produced, in a known manner, for example, using the Smart Cut™ technology, which includes the following steps: implantation of gaseous species (H, He, etc., separately or in combination) in an oxidized silicon first substrate in order to form a weakened zone in said substrate, defining a donor silicon wafer; bonding, for example by molecular adhesion, the first silicon substrate to a second silicon substrate corresponding to the support substrate prepared as described above; splitting (thermally and/or mechanically) the donor silicon wafer at the zone weakened by the implantation; and, optionally, finishing by chemical etching, polishing/planarization and/or heat treatment. A SOI structure comprising a silicon support substrate with a buried oxide layer and a silicon film obtained by transferring the donor silicon wafer is thus obtained.

The SOI structure 4 is bonded to the oxide bonding layer 3, for example, by means of very low-temperature bonding, which can be achieved for example with molecular adhesion bonding via plasma activation (oxygen plasma, nitrogen plasma, etc.). Annealing in a temperature range between approximately 600° C. and 1100° C. may be applied so as to reinforce the bonding interface between the oxide bonding layer 3 and the SOI structure 4 (step S8, FIG. 2), but also to restore the initial properties of the silicon.

Figure 1F:
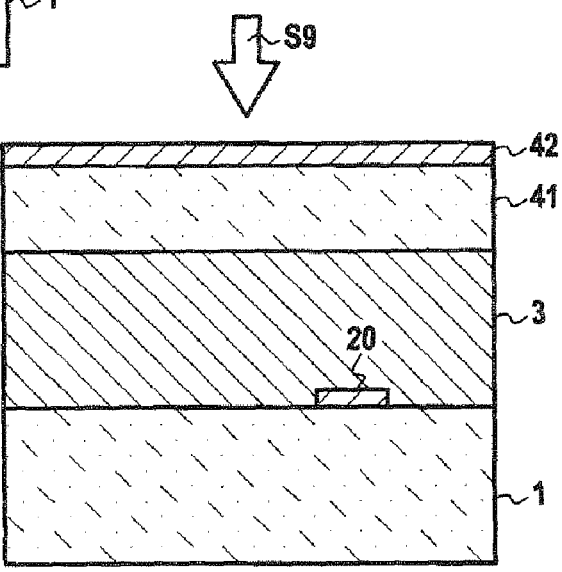

Next, the silicon substrate 43 is removed by wafer grinding, by polishing (for example, chemical mechanical polishing) and by chemical etching (step S9, FIG. 1F). The buried oxide layer 42 is also removed (step S10, FIG. 1G), for example by dry chemical etching (e.g. plasma etching) or wet chemical etching, or by selective etching using tetramethylammonium hydroxide (TMAH).

Figure 1G:
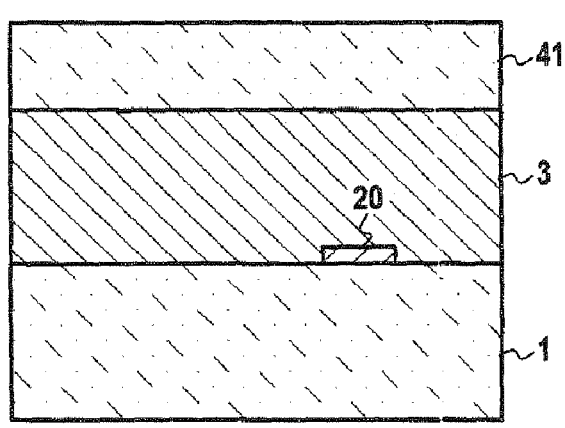
Figure 1H:
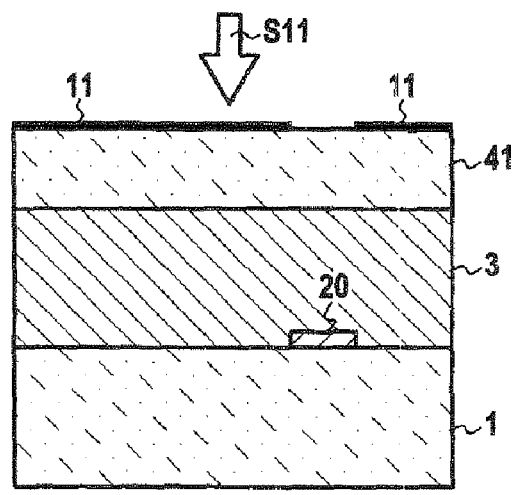

As shown in FIG. 1G, the resulting structure includes a bilayer structure of the SOI on silicon substrate type containing a germanium pattern 20.

Figure 1I:
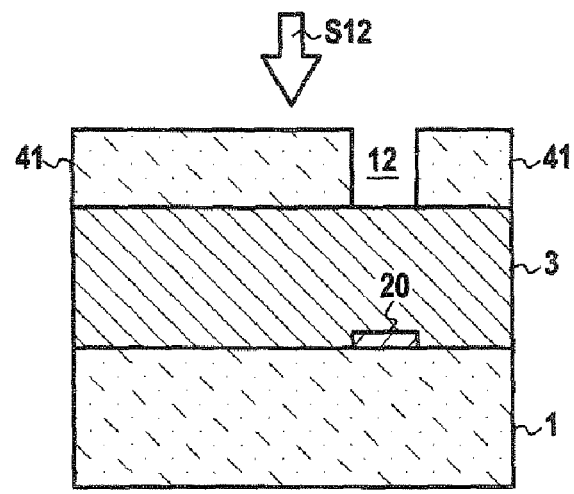
Figure 1J:
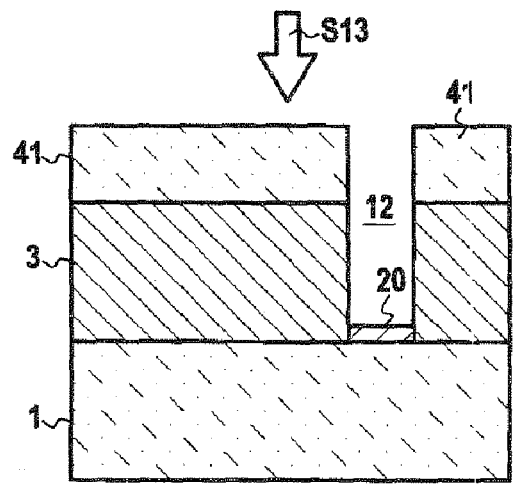

The next two steps include forming a cavity for opening the structure above the germanium pattern 20. As during step S3, an aperture mask 11 is applied on the silicon active layer 41 (step S11, FIG. 1H), for example by lithography, and then those parts of the silicon active layer 41 which are exposed through the aperture of the mask 11 are chemically etched (step S12, FIG. 1I). The aperture mask 11 must be aligned so as to open the layer 41 above the germanium pattern 20. The mask 11 corresponds to the countertype of the mask 10 used in step S3. Once the etching has been completed and the mask removed, the silicon active layer 41 has a cavity 12 that lies above the germanium pattern 20, as shown in FIG. 1I. Next, the part of the oxide layer 3 lying between the germanium pattern 20 and the cavity 12 is removed, by dry chemical etching (e.g. plasma etching) or wet etching, so as to extend said cavity down to the pattern 20 (step S13, FIG. 1J).

Figure 1K:
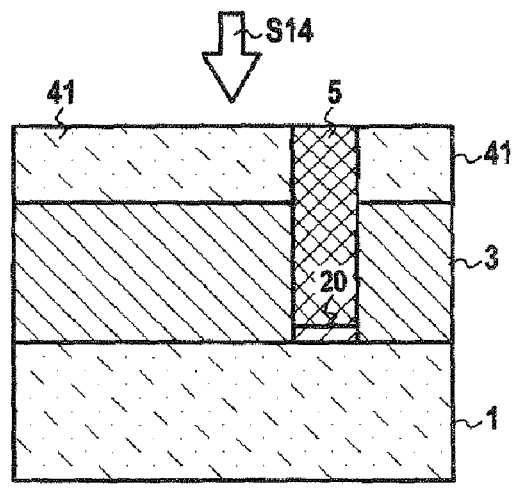
Figure 2:
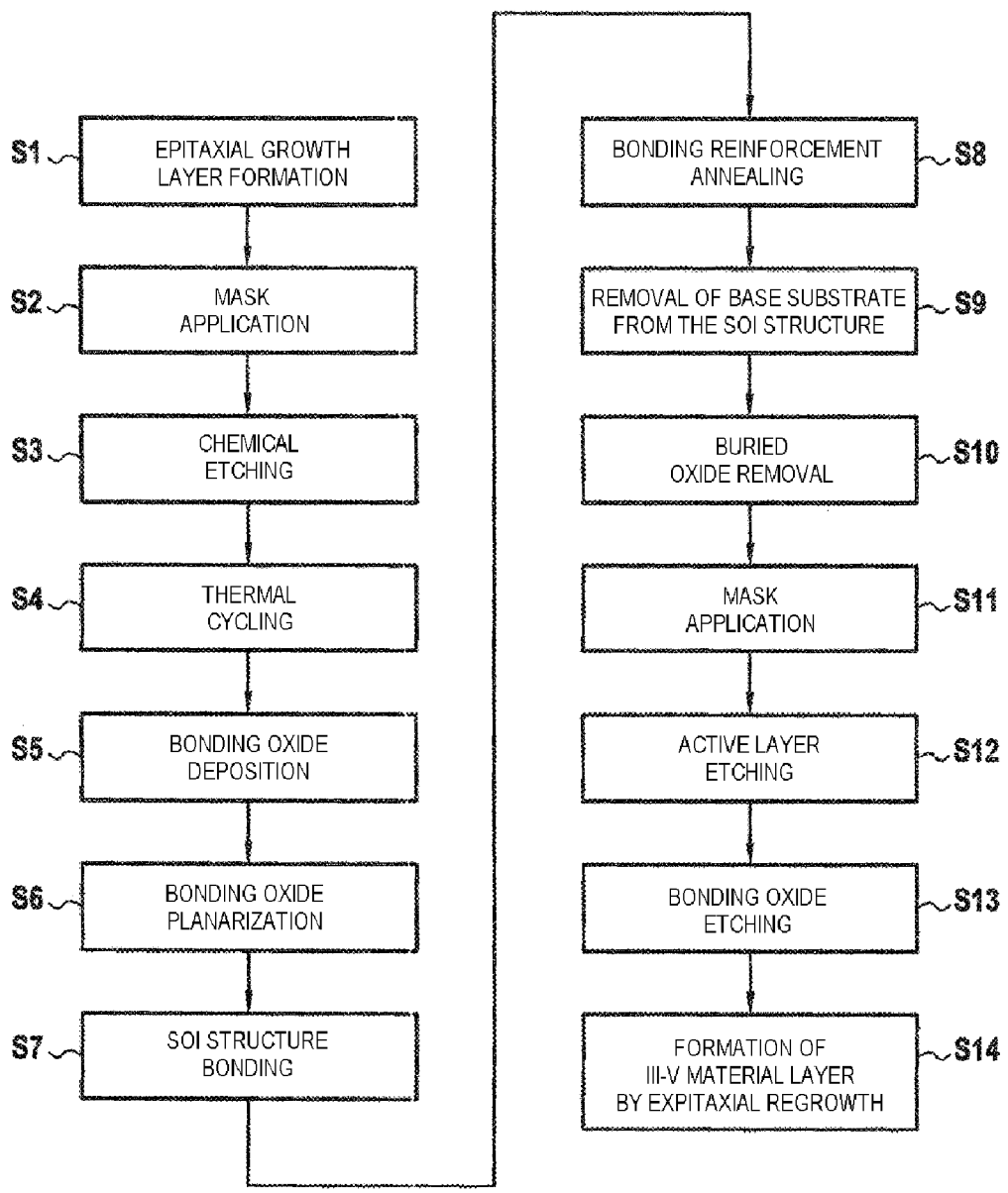
FIG. 2 is a flowchart further illustrating the steps described in FIGS. 1A to 1K.

Once the germanium pattern has been exposed, a selective epitaxial regrowth of gallium arsenide (GaAs) is carried out (step S14, FIG. 1K). This regrowth allows the cavity 12 to be filled with a GaAs island or pattern 5, consisting of gallium arsenide (GaAs) emerging level with the surface of the silicon active layer 41.

GaAs is not the only III-V material that can be formed on a germanium layer or pattern by epitaxial regrowth. For example, AlGaAs or InGaAs may also be formed from a germanium growth layer.

Moreover, the material of the growth layer is not limited to germanium. The growth layer may also be, for example, an aluminum nitride (AlN) layer formed on a (110) or (100) silicon substrate and from which it is possible to form III-V materials such as GaN, AlGaN, InGaN, and ZnGaN.

The fabrication process as described in this disclosure makes it possible for III-V materials and silicon to be homogeneously integrated on a single mechanical support, irrespective of the size of the wafers to be produced, such as for example 200 mm or 300 mm diameter wafers.

Many advantageous applications are possible with the multilayer structure as described in this disclosure. In particular, the island(s) of III-V materials formed may be used to produce optoelectronic components of the source or detector type, which can be used as connection means. The electronic chips fabricated from such a structure may then be connected to external devices via optical links (for example connection to optical fibers or waveguides) and benefit from larger bandwidths and data rates than is possible with current electrical connections and links known in the art.

According to another advantageous application, the structure of the invention may be used for placing, within a silicon circuit, a set of transistors based on III-V material of greater intrinsic performance (switching speed, through-current, etc.) than current MOS transistors.

It will be apparent to those skilled in the art that various modifications and variations can be made in the structure and method of the present invention without departing from the scope of the invention as defined by the appended claims and their equivalents.

What is claimed is:

1. A multilayer semiconductor structure comprising:
   a) a silicon substrate;
   b) a growth layer of a III-V material defined by at least one pattern disposed on the silicon substrate;
   c) an oxide layer disposed on the silicon substrate; and
   d) a silicon active layer disposed on the oxide layer, wherein the oxide layer and the silicon active layer each define a cavity therein above the at least one pattern, the cavity being filled with a III-V material.

2. The structure of claim 1, wherein the silicon substrate includes misoriented silicon.

3. The structure of claim 1, wherein the growth layer includes germanium.

4. The structure of claim 3, wherein each pattern is substantially free of dislocations.

5. The structure of claim 3, wherein the III-V material is selected from the group consisting of GaAs, AlGaAs, and InGaAs.

6. The structure of claim 1, wherein the growth layer includes aluminum nitride.

7. The structure of claim 6, wherein the III-V material is selected from the group consisting of GaN, AlGaN, InGaN, and ZnGaN.

* * * * *